(12) United States Patent
Iwadate et al.

(10) Patent No.: US 7,187,174 B2
(45) Date of Patent: Mar. 6, 2007

(54) RF RECEIVING COIL APPARATUS AND MAGNETIC RESONANCE IMAGING APPARATUS

(75) Inventors: Yuji Iwadate, Tokyo (JP); Tetsuji Tsukamoto, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 11/438,524

(22) Filed: May 22, 2006

(65) Prior Publication Data

US 2006/0267587 A1 Nov. 30, 2006

(30) Foreign Application Priority Data

May 26, 2005 (JP) ............................. 2005-154369

(51) Int. Cl.
*G01V 3/00* (2006.01)
(52) U.S. Cl. .................................................. 324/318
(58) Field of Classification Search ................. 324/318
See application file for complete search history.

(56) References Cited

U.S. PATENT DOCUMENTS

| 4,534,358 A | 8/1985 | Young | |
| 2004/0000907 A1* | 1/2004 | Ahluwalia et al. | 324/309 |
| 2005/0104591 A1* | 5/2005 | Qu et al. | 324/318 |

FOREIGN PATENT DOCUMENTS

JP 2004-041729 2/2004

* cited by examiner

*Primary Examiner*—Brij Shrivastav
*Assistant Examiner*—Megann E. Vaughn
(74) *Attorney, Agent, or Firm*—Carl B. Horton, Esq.; Armstrong Teasdale LLP

(57) ABSTRACT

With a view to providing a receiving coil which permits a subject to assume a supine position when radiographing the breast of the subject, thereby improving the working efficiency, a receiving coil for receiving a magnetic resonance signal from the breast of a subject lying within a static magnetic field space is provided in each of a first cup and a second cup of a brassiere which cups receive the breast of the subject SU therein.

20 Claims, 4 Drawing Sheets

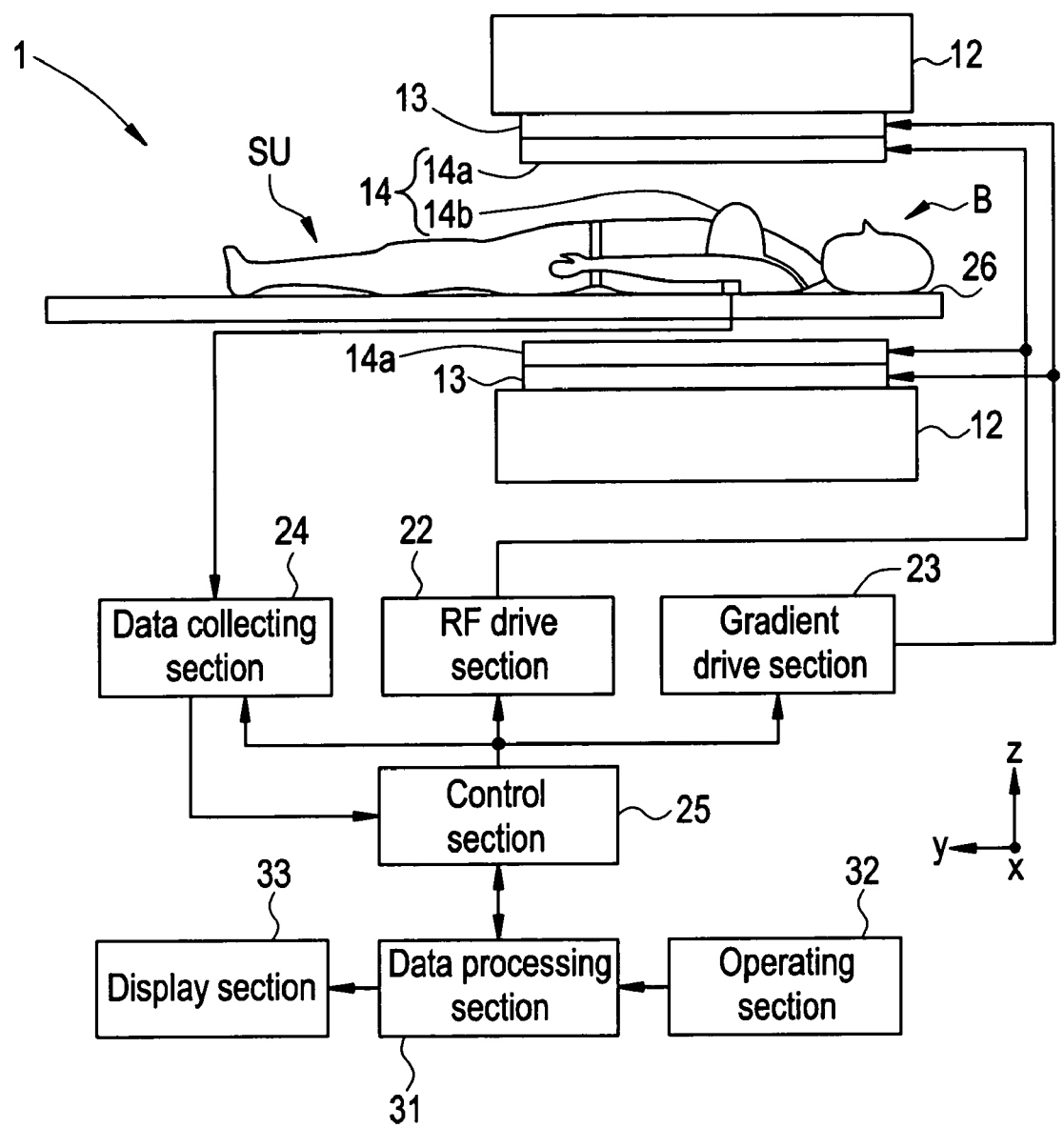

RF RECEIVING COIL APPARATUS AND MAGNETIC RESONANCE IMAGING APPARATUS

CROSS REFERENCE TO RELATED APPLICATIONS

This application claims the benefit of Japanese Application No. 2005-154369 filed May 26, 2005.

BACKGROUND OF THE INVENTION

The present invention relates to an RF receiving coil apparatus and a magnetic resonance imaging apparatus.

A magnetic resonance imaging (MRI) system is known as a system able to form a tomographic image of a subject by utilizing a nuclear magnetic resonance (NMR) phenomenon. In many cases the magnetic resonance imaging apparatus is utilized in medical and industrial fields.

For forming a tomographic image of a subject by using a magnetic resonance imaging apparatus, first the subject is placed within a radiographing space with a static magnetic field formed therein and then the direction of spin in proton within the subject is aligned with the direction of the static magnetic field to create a state of having obtained a magnetization vector. Thereafter, an electromagnetic wave having a resonance frequency is emitted from an RF coil, whereby a nuclear magnetic resonance phenomenon is generated to change the magnetization vector of proton. Then, the magnetic resonance imaging apparatus receives in the RF coil a magnetic resonance signal from proton which returns to the original magnetization vector, and forms a tomographic image of the subject in accordance with the received magnetic resonance signal.

In magnetic resonance imaging, MR mammography is utilized for early-stage detection and treatment of a cancer of the breast. In the MR mammography, a subject assumes a prone position so that his or her breast is received in an RF coil, and then scanning of the breast is carried out (see, for example, Patent Literature 1).

[Patent Literature 1] Japanese Patent Laid Open No. 2004-41729

Thus, in MR mammography, since the scanning is carried out in a prone position of the subject, breathing may be difficult or arms may become numbed, resulting in that the subject cannot retain the prone position for a long time, thus making it difficult to improve the working efficiency in radiographing.

Generally, when a subject undergoes an operation on his or her breast, the subject is brought into a supine position, and thus the posture of the subject differs between during scan and during operation. Consequently, when observing a pre-radiographed breast image in an operation of a breast, there sometimes occurs a case where it is difficult to easily specify an operation site, thus making it difficult to improve the working efficiency in the operation.

SUMMARY OF THE INVENTION

Therefore, it is an object of the present invention to provide an RF receiving coil apparatus and a magnetic resonance imaging apparatus which permits a subject to assume a supine position at the time of radiographing a breast, thereby making it possible to improve the working efficiency.

According to the present invention, for achieving the above-mentioned object, there is provided an RF receiving coil apparatus comprising: a coil for receiving a magnetic resonance signal provided from a breast of a subject lying within a static magnetic field space; and a brassiere including a cup for receiving therein the breast of the subject and a cup fixing portion for fixing the cup to the subject, wherein the coil is provided in the cup portion.

According to the present invention, for achieving the above-mentioned object, there also is provided a magnetic resonance imaging apparatus wherein a magnetic resonance signal provided from a breast of a subject lying within a static magnetic field space is received by an RF receiving coil section and an image of the breast is formed on the basis of the magnetic resonance signal received by the RF coil, the RF receiving coil section comprising: a coil for receiving the magnetic resonance signal; and a brassiere including a cup for receiving therein the breast of the subject and a cup fixing portion for fixing the cup to the subject, the coil being provided in the cup portion.

According to the present invention it is possible to provide an RF receiving coil apparatus and a magnetic resonance imaging apparatus which permits a subject to assume a supine position when radiographing the breast of the subject, thereby making it possible to improve the working efficiency.

Further objects and advantages of the present invention will be apparent from the following description of the preferred embodiments of the invention as illustrated in the accompanying drawings.

BRIEF DESCRIPTION OF THE DRAWINGS

FIG. 1 illustrates the construction of a magnetic resonance imaging apparatus 1 according to an embodiment of the present invention.

FIG. 2 illustrates an RF receiving coil portion 14b used in the embodiment, in which

FIG. 3 is a sectional view showing the first cup 401a in the embodiment, in which

DETAILED DESCRIPTION OF THE INVENTION

Figure 2A:
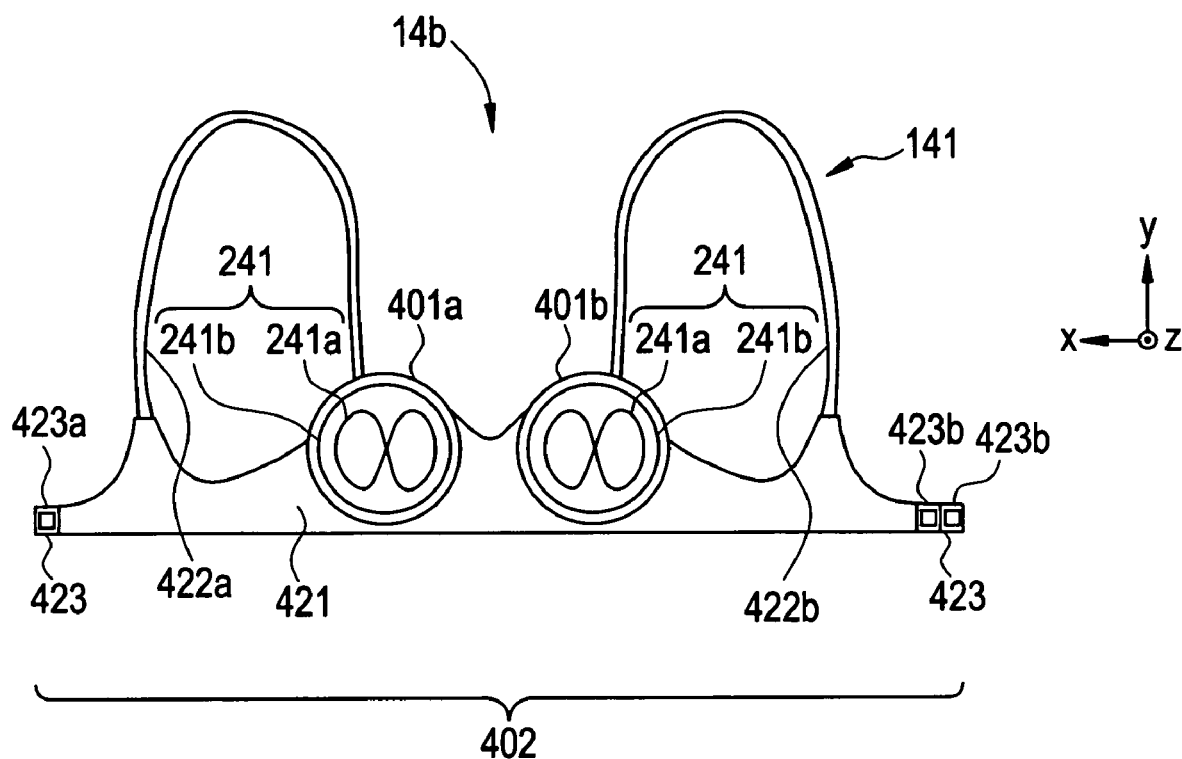
FIG. 2(a) is a front view showing the RF receiving coil portion 14b and FIG. 2(b) is an enlarged perspective view of a first cup 401a in the RF receiving coil portion 14b.

An embodiment of the present invention will be described hereinunder.

FIG. 1 illustrates the construction of a magnetic resonance imaging apparatus 1 embodying the present invention.

As shown in FIG. 1, the magnetic resonance imaging apparatus 1 includes a static magnetic field magnet section 12, a gradient coil section 13, an RF coil section 14, an RF drive section 22, a gradient drive section 23, a data collecting section 24, a control section 25, a cradle 26, a data processing section 31, an operating section 32, and a display section 33. The magnetic resonance imaging apparatus 1 radiates an electromagnetic wave to a subject SU lying within a radiographing space B with a static magnetic field formed therein, performs scanning for obtaining a magnetic resonance signal from the subject SU, and forms an image of the subject SU on the basis of the magnetic resonance signal obtained by the scan.

Components of the magnetic resonance imaging apparatus 1 of this embodiment will be described below one by one.

The static magnetic field magnet section 12 includes, for example, a pair of permanent magnets in a sandwiching relation to the radiographing space B and forms a static magnetic field in the radiographing space B in which the subject SU is accommodated. For example, the static magnetic field magnet section 12 forms a static magnetic field in a vertical direction Z in which the pair of permanent magnets confront each other. The static magnetic field magnet section 12 may be constructed so as to include magnets such as superconducting magnets other than the permanent magnets.

The gradient coil section 13 forms gradient magnetic fields within the radiographing space B with a static magnetic field formed therein. The gradient coil section 13 includes three systems of gradient coils so as to generate gradient magnetic fields which are gradient in the direction of three axes orthogonal to one another. With the three systems of gradient coils, the gradient coil section 13 forms gradient magnetic fields in a frequency encoding direction, a phase encoding direction and a slice selecting direction according to radiographing conditions.

More specifically, the gradient coil section 13 applies a gradient magnetic field in a slice selecting direction of the subject SU and selects a slice of the subject SU which is excited by transmission of RF pulse from the RF coil section 14.

Moreover, the gradient coil 13 applies a gradient magnetic field in a phase encoding direction of the subject SU and encodes the phase of a magnetic resonance signal provided from the RF pulse-excited slice. Further, the gradient coil section 13 applies a gradient magnetic field in a frequency encoding direction of the subject SU and encodes the frequency of a magnetic resonance signal provided from the RF pulse-excited slice.

Within the radiographing space B in which a static magnetic field is formed by the static magnetic field magnet section 12, the RF coil section 14 transmits RF pulse from an RF transmitting coil portion 14a to the subject SU to form a high frequency magnetic field, thereby exciting a spin of proton in a radiographing region of the subject SU. Then, in the RF coil section 14, an electromagnetic wave generated from the excited proton in the subject SU is received as a magnetic resonance signal by an RF receiving coil portion 14b. In this embodiment, a magnetic resonance signal provided from the breast of the subject SU is received. As to the details of the RF receiving coil portion 14b, a description will be given later.

The RF drive section 12 drives the RF coil section 14 for the transmission of RF pulse into the radiographing space B to form a high-frequency magnetic field. In accordance with a control signal provided from the control section 25 and using a gate modulator, the RF drive section 22 modulates a signal provided from an RF oscillator into a signal having a predetermined timing and a predetermined envelope, thereafter, using an RF power amplifier, amplifies the signal having been modulated by the gate modulator, and outputs the amplified signal to the RF coil section 14, allowing RF pulse to be transmitted.

In accordance with a control signal provided from the control section 25, the gradient drive section 23 drives the gradient coil section 13 by applying a gradient pulse thereto, causing a gradient magnetic field to be developed within the radiographing space B with a static magnetic field formed therein. The gradient drive section 23 has three systems of drive circuits (not shown) correspondingly to the gradient coil section 13 of three systems.

In accordance with a control signal provided from the control section 25 the data collecting section 24 collects the magnetic resonance signal which the RF coil section 14 receives and then outputs the collected signal to the data processing section 31. The data collecting section 24 collects the magnetic resonance signal having been subjected to phase encoding and frequency encoding so as to correspond to the k space. In the data collecting section 24, the magnetic resonance signal which the RF coil section 14 receives is subjected to phase detection using the output of the RF oscillator in the RF drive section 22 as a reference signal. Thereafter, using an A/D converter, the data collecting section 24 converts the magnetic resonance signal as an analog signal into a digital signal. The data collecting section 24 stores this magnetic resonance signal in memory and then outputs it to the data processing section 31.

The control section 25 has a computer and programs for allowing various portions to execute operations corresponding to a predetermined scan with use of the computer. In accordance with an operation signal inputted from the operating section 32 through the data processing section 31, the control section 25 outputs a control signal for execution of the predetermined scan to each of the RF drive section 22, gradient drive section 23 and data collecting section 24 and makes control.

As shown in FIG. 1, the cradle 26 has a table for placing the subject SU thereon. In accordance with a control signal provided from the control section 25 the cradle 26 moves the subject SU placed on the table over an area between the interior and the exterior of the radiographing space B. For example, the cradle 26 moves the subject SU in a central axis direction of the radiographing space B which is in the shape of a column.

The data processing section 31 has a computer and programs for the execution of predetermined data processings with use of the computer. The data processing section 31 is connected to the operating section 32 and an operation signal provided from the operating section 32 is inputted to the data processing section 31. The data processing section 31 is connected also to the control section 25 and outputs an operation signal to the control section 25 which signal is inputted to the operating section 32 by an operator. The data processing section 31 is further connected to the data collecting section 24 and acquires a magnetic resonance signal collected by the data collecting section 24, then performs an image processing on the magnetic resonance signal thus acquired and forms an image on a slice of the subject SU. For example, the data processing section 31 performs a Fourier transform processing on a magnetic resonance signal which has been converted to a digital signal to form an image of the subject SU. Then, the data processing section 31 outputs the thus-formed image to the display section 33.

The operating section 32 is composed of operating devices, including a keyboard and a mouse. The operating section 32, which is operated by the operator, outputs an operation signal corresponding to operation performed by the operator to the data processing section 31. In this embodiment, the operating section 32 is constructed so that the operator can select and input a scan over plural pulse sequences according to radiographing purposes.

The display section 33 is constituted by a display device such as CRT. The display section 33 displays an image on the slice of the subject SU which is generated on the basis of the magnetic resonance signal provided from the subject SU.

A detailed description will be given below about the RF receiving coil portion 14b in the RF coil section 14.

Figure 2B:
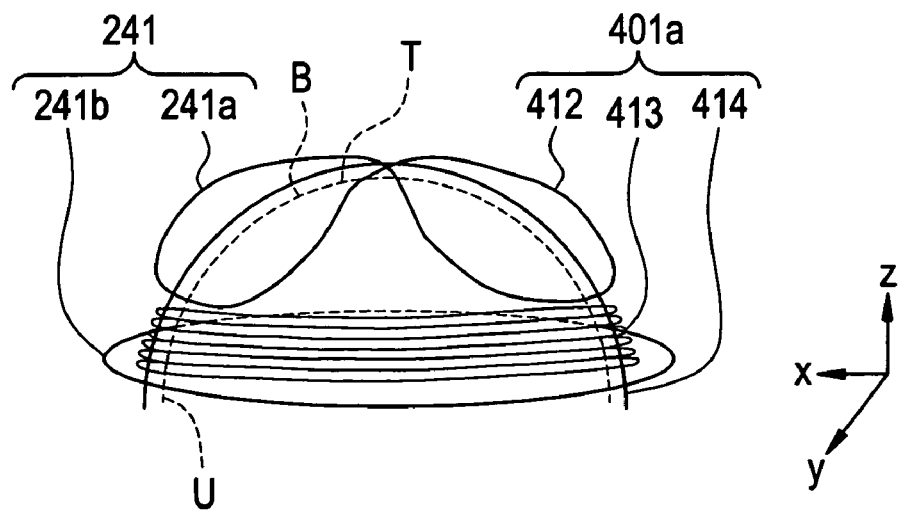

FIG. 2 illustrates the RF receiving coil portion 14b, in which FIG. 2(a) is a front view of the RF receiving coil portion 14b and FIG. 2(b) is an enlarged perspective view of a first cup 401a in the RF receiving coil portion 14b.

As shown in FIG. 2, the RF receiving coil portion 14b has a brassiere 141 and receiving coils 241. These components will be described below one by one.

The brassiere 141 will be described first.

As shown in FIG. 2(a), the brassiere 141 includes a first cup 401a, a second cup 401b, and a cup fixing portion 402, and encloses the breast B of the subject SU as a human body in good shape.

The first cup 401a and the second cup 401b in the brassiere 141 are formed in the same shape. In this embodiment, as shown in FIG. 2(b), the first cup 401a and the second cup 401b are each formed so as to have a semispherical space, and breasts of the subject SU are accommodated within the semispherical spaces respectively. More particularly, the first cup 401 a receives therein the right breast of the subject SU, while the second cup 401b receives therein the left breast of the subject SU.

As shown in FIG. 2(b), the first cup 401a and the second cup 401b each include a first cover member 412, a cover connecting member 413, and a second cover member 414.

The first cover member 412 is formed in a semispherical shape using cloth of both nylon and urethane fibers knitted therein for example so as to cover a top side T of the breast of the subject SU. The first cover member 412 is sewed to the cover connecting member 413. In the first cover 412, as shown in FIG. 2(b), a saddle-shaped coil 241a in the receiving coil 241 is provided on the top side T so as to cover the top side T of the breast B of the subject SU.

As shown in FIG. 2(b), the cover connecting member 413 is provided so as to be sandwiched between the first cover member 412 and the second cover member 414. The cover connecting member 413 is sewed to each of the first cover member 412 and the second cover member 414, connecting both cover members with each other. The cover connecting member 413 is formed as a ring-shaped bellows mechanism using a plastic material for example and is adapted to expand and contract so that it can be fixed at any of plural different lengths between the top side T and an under side U of the breast of the subject SU.

Figure 3A:
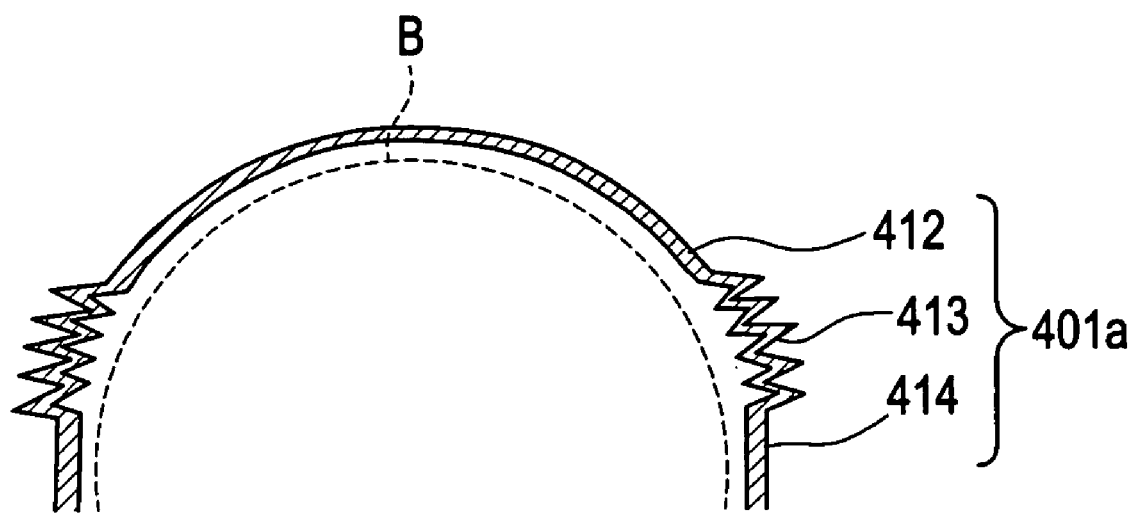
FIG. 3(a) shows a contracted state of a bellows mechanism of a cover connecting member 413 in the first cup 401a and FIG. 3(b) shows an expanded state of the bellows mechanism.
Figure 3B:
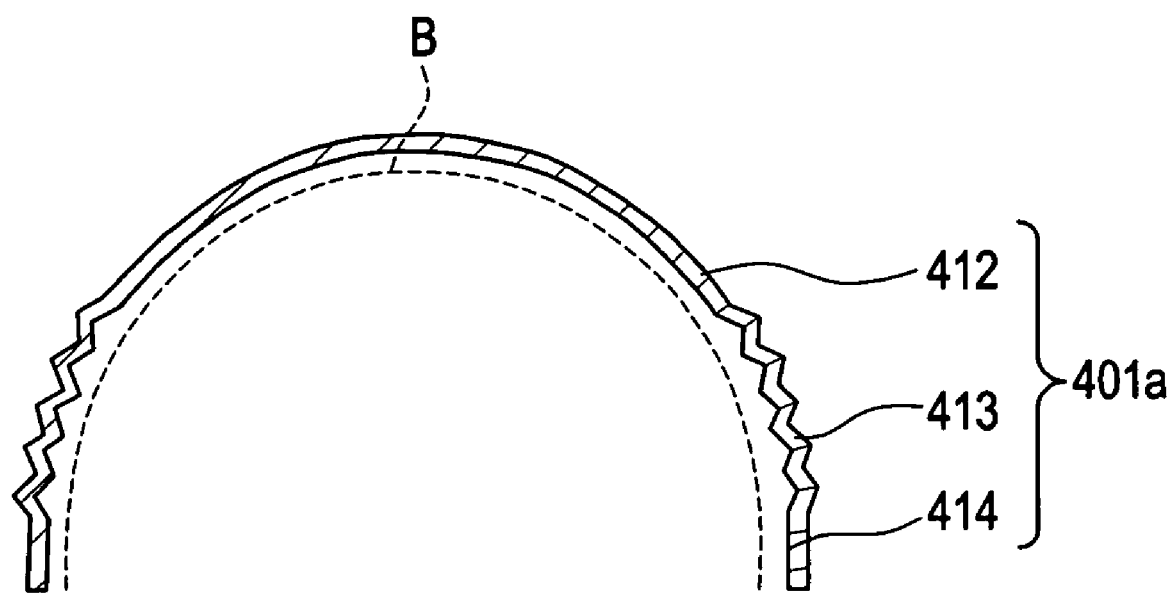

FIG. 3 is a sectional view showing the first cup 401a, in which FIG. 3(a) shows a contracted state of the bellows mechanism of the cover connecting member 413 in the first cup 401a and FIG. 3(b) shows an expanded state of the bellows mechanism of the cover connecting member 413 in the first cup 401a.

In case of the breast B of the subject SU being small in volume, as shown in FIG. 3(a), the cover connecting member 413 is used in a contracted state of the bellows mechanism. In case of the breast B of the subject SU being large in volume, as shown in FIG. 3(b), the cover connecting member 413 is used in an expanded state of the bellows mechanism.

The second cover 414 is formed in a ring shape using cloth of both nylon and urethane fibers knitted therein so as to cover the under side U of the subject SU. The second cover member 414 is sewed to the cover connecting member 413. In the second cover member 414, as shown in FIG. 2(b), a loop shaped coil 241b is provided on the under side U of the breast of the subject Su so as to surround the under side U.

The cup fixing portion 402 of the brassiere 141 is provided for fixing the first cup 401a and the second cup 401b to the subject SU.

As shown in FIG. 2, the cup fixing portion 402 includes a trunk belt 421, a first shoulder belt 422a, a second shoulder belt 422b, and trunk belt connecting portions 423.

The trunk belt 421 is formed of cloth for example and is sewed so that the first and second cups 401a, 401b are arranged side by side in the extending direction of the belt. By being wound round the trunk portion of the subject SU, the trunk belt 421 fixes the first and second cups 401a, 401b to the subject SU.

The first shoulder belt 422a is formed of cloth for example and one end thereof is connected by sewing to the first cup 401a so as to extend in direction nearly perpendicular to the extending direction of the trunk belt 421. To the portion of the trunk belt 421 extending in the direction opposite to the direction extending from the first cup 401a to the second cup 401b, an opposite end of the shoulder belt 422a is connected by sewing so as to extend in a direction nearly perpendicular to the extending direction of the trunk belt 421. That is, the first shoulder belt 422a is connected to both first cup 401a and trunk belt 421 so as to describe a loop and, by being wound round a shoulder portion of the subject Su, fixes the breast B in the first cup 401a in a suspended manner to the subject SU.

The second shoulder belt 422b is formed of cloth for example and one end thereof is connected by sewing to the second cup 401b so as to extend in a direction nearly perpendicular to the extending direction of the trunk belt 421. To the portion of the trunk belt 421 extending in the direction opposite to the direction extending from the second cup 401b to the first cup 401a, an opposite end of the second shoulder belt 422b is connected by sewing so as to extend in a direction nearly perpendicular to the extending direction of the trunk belt 421. That is, the second shoulder belt 422b is connected to both second cup 401b and trunk belt 421 so as to describe a loop and, by being wound round a shoulder portion of the subject SU, fixes the breast B in the second cup 401b in a suspended manner to the subject SU.

The trunk belt connecting portion 423 includes a hook 423a fixed by sewing to one end of the trunk belt 421 and a ring 423b fixed by sewing to an opposite end of the trunk belt 421. The hook 423a is engaged with the ring 423b to connect both ends of the trunk belt 421 with each other. In this embodiment, the ring 423b is installed in plural positions at the opposite end of the trunk belt 421 and the hook 423a is brought into engagement with any of the rings 423b located at plural different positions, whereby the trunk belt 421 can be fixed at any of plural different lengths.

The following description is now provided about the receiving coil 241.

The receiving coil 241 receives a magnetic resonance signal from the breast B of the subject SU lying in a static magnetic field space 11. As shown in FIG. 2, the receiving coil 241 includes the saddle-shaped coil 241a and the loop-shaped coil 241b so as to permit two-channel reception.

The saddle-shaped coil 241a is provided on the top side T of each of the first cup 401a and the second cup 401b so as to cover the top side T of the breast B of the subject SU. More specifically, as shown in FIG. 2(b), the saddle-shaped coil 241a is provided in the first cover member 412 of each of the first cup 401a and the second cup 401b.

On the other hand, the loop-shaped coil 241b is provided on the under side U of each of the first cup 401a and the second cup 401b so as to surround the under side U of the breast of the subject SU. More specifically, as shown in FIG. 2(b), the loop-shaped coil 241b is provided in the second cover member 414 of each of the first cup 401a and the second cup 401b. As the loop-shaped coil 241b it is preferable to use, for example, a copper wire for retaining the shape of the breast B of the subject SU.

The saddle-shaped coil 241a and the loop-shaped coil 241b are geometrically decoupled and, by expansion and contraction of the cover connecting members 413 of the first cup 401a and the second cup 401b respectively, both coils move in parallel with each other so that there is little interference caused by mutual inductance.

Thus, in the magnetic resonance imaging apparatus 1 of this embodiment, the receiving coils 241 for receiving magnetic resonance signals from the breast of the subject SU lying within a static magnetic field space are provided respectively in the first cup 401a and the second cup 401b in the brassiere which cups accommodate the breast of the subject SU. Therefore, when the subject SU assumes a supine position for radiographing the breast, the breast B of the subject SU is enclosed by the first and second cups 401a, 401b of the brassiere 141 and assumes an orderly state, so that the receiving coils 241 can receive magnetic resonance signals from the breast B of the subject SU. Consequently, in this embodiment, not only the subject SU can perform the breathing action easily, but also his or her arms can be prevented from becoming numbed, thus making it possible to effect radiographing over a long time and permitting the operator to improve the working efficiency in radiographing. Besides, since the posture of the subject SU in radiographing and that in operation become the same, it is possible to easily specify an operation site at the time of operation of the breast B and hence possible to improve the working efficiency during operation. Thus, according to this embodiment, the subject SU can be brought into a supine position at the time of radiographing the breast, whereby the working efficiency can be improved.

In this embodiment, moreover, each of the first and second cups 401a, 401b is allowed to expand and contract between the top side T and the under side U of the breast B of the subject SU by the cover connecting member 413 which includes a bellows mechanism. Therefore, by expanding and contracting the bellows mechanism of each cover connecting member 413, the volume of the space in which the breast B of the subject SU is received in each of the first and second cups 401a, 401b can be changed to match the volume of the breast B. Therefore, in this embodiment, the receiving coils 241 provided respectively in the first cup 401a and the second cup 401b can be made closer to the breast B of the subject SU to match the volume of the breast B, whereby it is possible to obtain an image of high quality and easily specify an operation site at the time of operation of the breast B. Thus, in this embodiment, the subject SU can be brought into a supine position at the time of radiographing the breast and it is thereby possible to improve the working efficiency.

Further, in this embodiment, the trunk belt connecting members 423 for connecting both ends of the trunk belt 421 of the cup fixing portion 402 are formed in such a manner that they can fix the trunk belt 421 at any of plural different lengths. Therefore, in this embodiment, the cup fixing portion 402 can fix each of the first cup 401a and the second cup 401b to the subject SU to match the length of the trunk portion of the subject SU. Consequently, when the subject SU is brought into a supine position, the shape of the breast B of the subject SU can be maintained in an orderly state by the first and second cups 401a and 401b. Thus, in this embodiment the subject SU can be brought into a supine position at the time of radiographing the breast and hence it is possible to improve the working efficiency.

In the above embodiment, the magnetic resonance imaging apparatus 1 corresponds to the magnetic resonance imaging apparatus of the present invention. The radiographing space B in the above embodiment corresponds to the static magnetic field space in the present invention. The RF receiving coil portion 14b in the above embodiment corresponds to the RF receiving coil section and the RF receiving coil apparatus in the present invention. The brassiere 141 in the above embodiment corresponds to the brassiere in the present invention. The receiving coil 241 in the above embodiment corresponds to the coil in the present invention. The saddle-shaped coil 241a in the above embodiment corresponds to the first coil in the present invention. The loop-shaped coil 241b in the above embodiment corresponds to the second coil in the present invention. The first cup 401a in the above embodiment corresponds to the cup in the present invention. The second cup 401b in the above embodiment corresponds to the cup in the present invention. The cup fixing portion 402 in the above embodiment corresponds to the cup fixing portion in the present invention. The first cover member 412 in the above embodiment corresponds to the first cover member in the present invention. The cover connecting member 413 in the above embodiment corresponds to the cover connecting member in the present invention. The second cover member 414 in the above embodiment corresponds to the second cover member in the present invention. The trunk belt 421 in the above embodiment corresponds to the trunk belt in the present invention. The first shoulder belt 422a in the above embodiment corresponds to the shoulder belt in the present invention. The second shoulder belt 422b in the above embodiment corresponds to the shoulder belt in the present invention. Further, the trunk belt connecting portion 423 in the above embodiment corresponds to the trunk belt connecting member in the present invention.

In practicing the present invention, no limitation is made to the above embodiment, but various modifications may be adopted.

FIG. 4 is a sectional view showing a first cup 401a according to a modification.

Figure 4A:
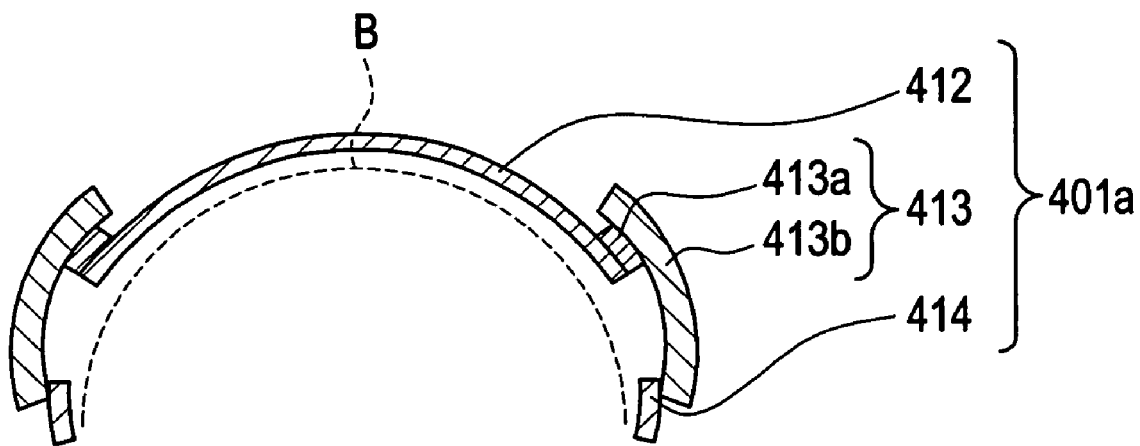
FIG. 4a is a sectional view showing a first cup 401a in a first operational position.
Figure 4B:
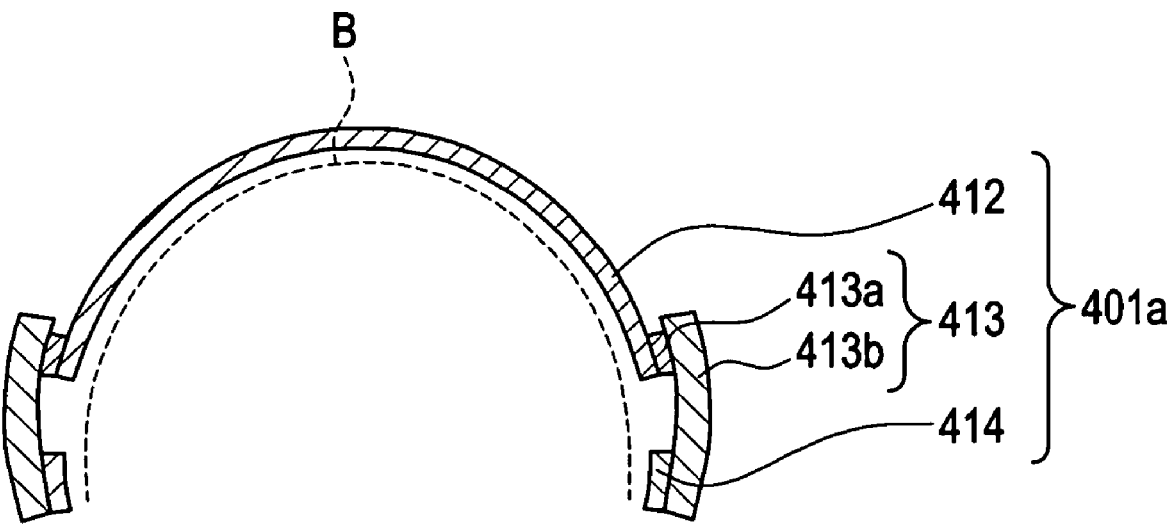
FIG. 4b is a sectional view showing the first cup 401a in a second operational position.

For example, as shown in FIG. 4, as the cover connecting member 413 there may be used a face zipper comprising a pair of a hook portion 413a and a loop portion 413b, such as Magic Tale (trademark). As shown in FIG. 4(a), in case of the breast B of the subject SU being small in volume, the loop portion 413b of the face zipper is engaged with the hook portion 413a so as to shorten the distance between the first cover member 412 and the second cover member 414. In case of the breast B of the subject SU being large in volume, as shown in FIG. 4(b), the loop portion 413b of the face zipper is engaged with the hook portion 413a so as to lengthen the distance between the first cover member 412 and the second cover member 414.

For example, the trunk belt connecting portion 423 may be provided so as to be what is called a front hook type. That is, the hook 423a and the ring 423b of the trunk belt connecting portion 423 may be provided in the trunk belt 421 located between the first cup 401a and the second cup 401b, thereby making possible the engaging motion between the hook 423a and the ring 423b on the chest side of the subject SU and making the brassiere removable on the chest side of the subject SU. In this portion, as in the above embodiment, the trunk belt 421 may be formed so as to be adjustable among plural different lengths.

Many widely different embodiments of the invention may be configured without departing from the spirit and the scope of the present invention. It should be understood that the present invention is not limited to the specific embodiments described in the specification, except as defined in the appended claims.

The invention claimed is:

1. An RF receiving coil apparatus comprising:
    a coil for receiving a magnetic resonance signal provided from a breast of a subject lying within a static magnetic field space; and
    a brassiere comprising a cup for receiving therein the breast of said subject and a cup fixing portion for fixing said cup to said subject, said cup fixing portion comprising a shoulder belt connected to said cup, said shoulder belt being adapted to be positioned about a shoulder portion of said subject to thereby fix said cup to said subject,
    wherein said coil is provided in said cup portion.

2. An RF receiving coil apparatus according to claim 1, wherein said cup is formed so as to expand and contract between a top side and an under side of the breast of said subject.

3. An RF receiving coil apparatus according to claim 2, wherein said cup comprises:
    a first cover member for covering the top side of the breast of said subject;
    a second cover member for covering the under side of the breast of said subject; and
    a cover connecting member for connecting said first and said second cover member with each other,
    said cover connecting member being adapted to expand and contract so that it can be fixed to any of plural different lengths between the top side and the under side of said breast.

4. An RF receiving coil apparatus according to claim 3, wherein said cover connecting member includes a bellows mechanism adapted to expand and contract between the top side and the under side of the breast of said subject.

5. An RF receiving coil apparatus according to claim 3, wherein said coil comprises a first coil and a second coil, said first coil being provided in said first cover member so as to cover the top side of said breast, and said second coil being provided in said second cover member so as to surround the under side of said breast.

6. An RF receiving coil apparatus according to claim 1, wherein said cup fixing portion includes a trunk belt connected to said cup, said trunk belt being adapted to be wound round a trunk portion of said subject to thereby fix said cup to said subject.

7. An RF receiving coil apparatus according to claim 6, wherein said cup fixing portion includes a trunk belt connecting member for connecting both end portions of said trunk belt, said trunk belt connecting member being formed so that it can fix said trunk belt at any of plural different lengths.

8. A magnetic resonance imaging apparatus wherein a magnetic resonance signal provided from a breast of a subject lying within a static magnetic field space is received by an RF receiving coil section and an image of said breast is formed on the basis of said magnetic resonance signal received by said RF coil,
    said RF receiving coil section comprising:
    a coil for receiving said magnetic resonance signal; and
    a brassiere comprising a cup for receiving therein the breast of said subject and a cup fixing portion for fixing said cup to said subject, said cup fixing portion comprising a shoulder belt connected to said cup, said shoulder belt being adapted to be positioned about a shoulder portion of said subject to thereby fix said cup to said subject,
    said coil being provided in said cup portion.

9. A magnetic resonance imaging apparatus according to claim 8, wherein said cup is formed so as to expand and contract between a top side and an under side of the breast of said subject.

10. A magnetic resonance imaging apparatus according to claim 9, wherein said cup comprises:
    a first cover member for covering the top side of the breast of said subject;
    a second cover member for covering the under side of the breast of said subject; and
    a cover connecting member for connecting said first and said second cover member with each other,
    said cover connecting member being adapted to expand and contract so that it can be fixed to any of plural different lengths between the top side and the under side of said breast.

11. A magnetic resonance imaging apparatus according to claim 10, wherein cover connecting member includes a bellow mechanism adapted to expand and contract between the top side and the under side of the breast of said subject.

12. A magnetic resonance imaging apparatus according to claim 10, wherein said coil comprises a first coil and a second coil, said first coil being provided in said first cover member so as to cover the top side of said breast, and said second coil being provided in said second cover member so as to surround the under side of said breast.

13. A magnetic resonance imaging apparatus according to claim 8, wherein said cup fixing portion includes a trunk belt connected to said cup, said trunk belt being adapted to be wound round a trunk portion of said subject to thereby fix said cup to said subject.

14. A magnetic resonance imaging apparatus according to claim 13, wherein said cup fixing portion includes a trunk belt connecting member for connecting both end portions of said trunk belt, said trunk belt connecting member being formed so that it can fix said trunk belt at any of plural different lengths.

15. An RF receiving coil apparatus comprising:
    a coil for receiving a magnetic resonance signal provided from a breast of a subject lying within a static magnetic field space; and
    a brassiere comprising a cup for receiving therein the breast of said subject, said cup is formed to expand and contract between a top side and an under side of the breast of said subject, said cup comprising a first cover member for covering the top side of the breast of said subject; a second cover member for covering the under side of the breast of said subject; and a cover connecting member for connecting said first cover member with said second cover member, said cover connecting member being adapted to expand and contract to be fixed to any of plurality of lengths between the top side and the under side of said breast, and a cup fixing portion for fixing said cup to said subject,
    wherein said coil is provided in said cup portion.

16. An RF receiving coil apparatus according to claim 15, wherein said cover connecting member includes a bellows mechanism adapted to expand and contract between the top side and the under side of the breast of said subject.

17. An RF receiving coil apparatus according to claim 15, wherein said coil comprises a first coil and a second coil, said first coil being provided in said first cover member so as to cover the top side of said breast, and said second coil being provided in said second cover member so as to surround the under side of said breast.

18. A magnetic resonance imaging apparatus wherein a magnetic resonance signal provided from abreast of a subject lying within a static magnetic field space is received by an RF receiving coil section and an image of said breast is formed on the basis of said magnetic resonance signal received by said RF coil, said RF receiving coil section comprising:

a coil for receiving said magnetic resonance signal; and a brassiere comprising a cup for receiving therein the breast of said subject said cup is formed so as to expand and contract between a top side and an under side of the breast of said subject, said cup comprising a first cover member for covering the top side of the breast of said subject; a second cover member for covering the under side of the breast of said subject; and a cover connecting member for connecting said first cover member with said second cover member, said cover connecting member being adapted to expand and contract to be fixed to any of plurality of lengths between the top side and the under side of said breast, and a cup fixing portion for fixing said cup to said subject, said coil being provided in said cup portion.

19. A magnetic resonance imaging apparatus according to claim 18, wherein said cover connecting member includes a bellows mechanism adapted to expand and contract between the top side and the under side of the breast of said subject.

20. A magnetic resonance imaging apparatus according to claim 18, wherein said coil comprises a first coil and a second coil, said first coil being provided in said first cover member so as to cover the top side of said breast, and said second coil being provided in said second cover member so as to surround the under side of said breast.

* * * * *

UNITED STATES PATENT AND TRADEMARK OFFICE
CERTIFICATE OF CORRECTION

PATENT NO. : 7,187,174 B2  Page 1 of 1
APPLICATION NO. : 11/438524
DATED : March 6, 2007
INVENTOR(S) : Iwadate et al.

It is certified that error appears in the above-identified patent and that said Letters Patent is hereby corrected as shown below:

In Claim 18, column 11, line 10, delete "abreast" and insert therefor -- a breast --.

Signed and Sealed this

Sixth Day of November, 2007

JON W. DUDAS
*Director of the United States Patent and Trademark Office*